(12) United States Patent
Sato

(10) Patent No.: US 8,941,519 B2
(45) Date of Patent: Jan. 27, 2015

(54) LIGHT INTENSITY SUBTRACTOR, OPTICAL A-D CONVERTER, AND METHOD FOR SUBTRACTING LIGHT INTENSITY

(75) Inventor: Kenji Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/990,168

(22) PCT Filed: Nov. 18, 2011

(86) PCT No.: PCT/JP2011/006440
§ 371 (c)(1),
(2), (4) Date: May 29, 2013

(87) PCT Pub. No.: WO2012/073447
PCT Pub. Date: Jun. 7, 2012

(65) Prior Publication Data
US 2013/0241756 A1 Sep. 19, 2013

(30) Foreign Application Priority Data

Dec. 1, 2010 (JP) .................................. 2010-268146

(51) Int. Cl.
*H03M 1/00* (2006.01)
*G02B 6/26* (2006.01)
(Continued)

(52) U.S. Cl.
CPC *G02B 6/262* (2013.01); *G02F 7/00* (2013.01); *G02F 1/011* (2013.01); *G02F 1/0212* (2013.01); *H03M 1/12* (2013.01); *G02F 1/2255* (2013.01); *G02F 2001/212* (2013.01)
USPC ................... 341/137; 385/3; 385/31; 385/11; 385/14; 385/27; 385/48; 385/16; 385/22; 385/103; 359/108; 359/239; 359/303; 341/130; 341/135

(58) Field of Classification Search
CPC . G02B 6/262; G02F 2001/212; G02F 1/0121; G02F 1/225; G02F 1/011; G02F 7/00; H03M 1/12
USPC ........ 341/130–155; 385/3, 31, 11, 14, 27, 48, 385/16, 22, 103, 148; 359/108, 239, 303
See application file for complete search history.

(56) References Cited

U.S. PATENT DOCUMENTS 5,253,309 A 10/1993 Nazarathy et al.
5,473,459 A * 12/1995 Davis ............................ 398/141
(Continued)

FOREIGN PATENT DOCUMENTS

JP 61-203566 U 12/1986
JP 64-056426 A 3/1989
(Continued)

*Primary Examiner* — Lam T Mai
(74) *Attorney, Agent, or Firm* — Sughrue Mion, PLLC

(57) ABSTRACT

A light intensity subtractor according to one aspect of the present invention includes a light subtraction unit, a feedback circuit, a light input port, a first light output port, and a second light output port. The light subtraction unit receives input light through the light input port, outputs first output light to the first light output port, and outputs second output light to the second light output port. The light subtraction unit generates the first output light by reducing the light intensity of the second output light from the light intensity of the input light in accordance with a control voltage. The feedback circuit is connected to the light subtraction unit through the second light output port, and outputs the control voltage in accordance with the light intensity of the received second output light.

17 Claims, 6 Drawing Sheets

(51) Int. Cl.
*G02F 7/00* (2006.01)
*G02F 1/01* (2006.01)
*H03M 1/12* (2006.01)
*G02F 1/225* (2006.01)
*G02F 1/21* (2006.01)

(56) References Cited

U.S. PATENT DOCUMENTS

| | | | |
|---|---|---|---|
| 6,608,854 B1 * | 8/2003 | Watanabe | 372/96 |
| 7,079,731 B2 * | 7/2006 | Shahar | 385/48 |
| 7,088,492 B2 * | 8/2006 | Yanagita et al. | 359/290 |
| 7,162,121 B2 * | 1/2007 | Shahar | 385/27 |
| 7,916,377 B2 * | 3/2011 | Witzens et al. | 359/239 |
| 8,155,484 B2 * | 4/2012 | Zalevsky et al. | 385/3 |
| 2008/0129564 A1 | 6/2008 | Kitayama et al. | |
| 2014/0099053 A1 * | 4/2014 | Sato et al. | 385/3 |

FOREIGN PATENT DOCUMENTS

| | | |
|---|---|---|
| JP | 03-184016 A | 8/1991 |
| JP | 04-294318 A | 10/1992 |
| JP | 2005-173530 A | 6/2005 |
| JP | 2006-276095 A | 10/2006 |
| JP | 2007-024924 A | 2/2007 |
| JP | 2008-052066 A | 3/2008 |

* cited by examiner

| FIRST ELECTRODE 14 | 0 | χ | π/2 | π |
|---|---|---|---|---|
| SECOND ELECTRODE 15 | π | χ - π | π/2 | 0 |

Fig. 4

LIGHT INTENSITY SUBTRACTOR, OPTICAL A-D CONVERTER, AND METHOD FOR SUBTRACTING LIGHT INTENSITY

CROSS REFERENCE TO RELATED APPLICATIONS

This application is a National Stage of International Application No. PCT/JP2011/006440, filed on Nov. 18, 2011, claiming priority from Japanese Patent Application No. 2010-268146, filed Dec. 1, 2010, the contents of all of which are incorporated herein by reference in their entirety.

TECHNICAL FIELD

The present invention relates to a light intensity subtractor, an optical A-D converter, and a method for subtracting light intensity and, particularly, to a light intensity subtractor, an optical A-D converter, and a method for subtracting light intensity that reduce certain light intensity from input light.

BACKGROUND ART

In middle and long distance optical communication systems, high-capacity communications are growing using high-speed and multiple-wavelength features. In the present trunk-line optical communication systems, wavelength multiplexing telecommunications are used. In the wavelength multiplexing telecommunications, the wavelength channel spacing is defined. Thus, when the wavelength channel spacing within the bandwidth of an optical fiber amplifier is 50 GHz, about 100 channels are available.

It is assumed that the channel spacing is $\Delta f$[Hz], and the transmission rate is B[bit/s]. The frequency efficiency in this case is represented as $B/\Delta f$ [bit/s/Hz]. When $\Delta f$=50 GHz and the transmission rate of each channel is 100 Gbit/s, the frequency efficiency is 2 bit/s/Hz.

Because the optical fiber amplifier bandwidth is limited, it is necessary to enhance the frequency efficiency. However, when the signal bit rate is merely increased in order to enhance the frequency efficiency, the problem of crosstalk between channels is raised. Thus, as the next generation optical communication system, multilevel optical modulation and orthogonal frequency-division multiplexing (OFDM) are under review.

The multilevel optical modulation is a modulation scheme that converts the amplitude and phase of light into multiple values, not only binary values of either 0 or 1. This increases the amount of information without increasing the frequency band. Further, in the optical OFDM, an OFDM signal is generated from an electrical signal and optically modulated and then multiplexed with optical sub-carriers being orthogonal to one another. As a result, it is possible to solve the problem of crosstalk and enhance the frequency efficiency.

The optical signal that is transmitted by multilevel modulation/multiplexing principally involving electrical signal processing is demodulated into the electrical signal at the receiving end. An analog-to-digital (A-D) converter is required in the subsequent stage of a photodetector (PD) of the optical demodulation circuit. An A-D converter using an electrical circuit is generally used today.

On the other hand, an A-D converter that derives an analog value of an optical signal directly as a digital signal is advantageous in its speed. Therefore, many proposals for the A-D converter that derives an analog value of an optical signal directly as a digital signal have been made. For example, in Patent Literature 1, the amount of light is represented by a specified ratio by dividing an optical signal at a specified dividing ratio. Then, an optical analog value of the input optical signal is detected depending on whether each divided optical signal reaches a threshold.

Further, in Patent Literature 2, a feedback system through a nonlinear optical element is constructed for an input optical signal, which is an analog signal, in an optical A/D conversion means. First output light, which is a digital signal, is thereby sequentially obtained from the optical A/D conversion means.

In Patent Literature 3, an optical encoding circuit that processes encoding and quantization by an optical signal is disclosed. As the optical encoding circuit, a plurality of optical encoders including optical nonlinear elements in which input/output characteristics for light intensity have different periodicities are used. A pulse string of signal light having a first wavelength is optically encoded according to control light, which is a pulse string of an optical analog signal having a second wavelength different from and close to the first wavelength and being an optical sampling signal, and a plurality of pulse strings of the encoded signal light are output from each of the optical encoders. Then, an optical quantization circuit performs optical threshold processing of a pulse string of carrier light having a third wavelength different from and close to the first wavelength according to the plurality of pulse strings of the encoded signal light using a plurality of optical threshold processors including optical nonlinear elements in which input/output characteristics for light intensity have periodicities and thereby makes quantization, and then outputs it as an optical digital signal.

In Patent Literature 4, an optical A/D conversion device including a plurality of interferometric optical modulators and photovoltaic elements formed on the same substrate is disclosed. The optical A/D conversion device has a feature that the output voltage of the photovoltaic element is applied to the interferometric optical modulator. In this example, intensity signal light received by a PD is converted from optical to electrical. Therefore the rate of the entire circuit is determined by the rate of the electrical signal after conversion.

Further, a phase difference, not limited to an intensity signal, may be used as a signal for light. An example using this technique is disclosed also in some of the above Patent Literatures. Further, there is an example that creates a phase difference from intensity, using light as it is, without performing photoelectric conversion for use. In Patent Literature 5, a logic holding/logic inversion signal generator that converts an optical signal that is on or off into a phase difference signal is disclosed.

In Patent Literature 6, a device that removes control light by a filter using a phase difference modulation signal is disclosed.

CITATION LIST

Patent Literature

PTL1: Japanese Unexamined Patent Application Publication No. 2007-24924
PTL2: Japanese Unexamined Patent Application Publication No. H01-56426
PTL3: Japanese Unexamined Patent Application Publication No. 2005-173530
PTL4: Japanese Unexamined Utility Model Application Publication No. S61-203566

PTL5: Japanese Unexamined Patent Application Publication No. 2006-276095
PTL6: Japanese Unexamined Patent Application Publication No. 2008-52066

SUMMARY OF INVENTION

Technical Problem

Attenuation of light intensity is theoretically possible by preparing a signal with an inverted phase for the amplitude and phase of input light and then making those signals interfere with each other using characteristics of a lightwave. In order to correctly invert and superimpose the phase, it is necessary to detect an exact phase of an input signal and generates a phase-inverted signal instantaneously. It is further necessary to make the input signal and the phase-inverted signal interfere with each other without time lag. In order to achieve those, a large-scale device is required, and adjustment of the device is complicated. It is thus desirable to achieve optical A/D conversion as simple as possible.

One way to solve the above problem is to configure an optical A-D converter simply using a Mach-Zehnder (MZ) interferometer and use phase information rather than light intensity information, as disclosed in Patent Literature 4. To achieve this, a device that efficiently converts a light intensity signal into a phase difference signal is required. For such an intensity/phase converter, different phase rotation amounts need to be made for the same light intensity.

Specifically, when the same number of MZ interferometers as the number of bits are prepared, a device that outputs different amounts of phase rotation for the same light intensity to each of the MZ interferometers is required. Further, although a structure to allow connection to a device that outputs a certain unit of phase rotation amount is desirable, it is difficult to achieve this simply. Therefore, in Patent Literature 4, different amounts of phase rotation are given after converting light into electricity. This makes the device structure complicated.

Further, to convert light intensity into phase, using the effect of known SPM (Self-Phase Modulation) or XPM (Cross-Phase Modulation), which is the characteristics of SOA element, the intensity/phase converter is placed within the MZ interferometer and thereby determination on light intensity is made. However, for output of m (m is an integer of 1 or above) bits, the m number of different phase rotation amounts need to be obtained in the intensity/phase converter. Therefore, the m number of phase converters, which have the length of m-th power of 2, are arranged in parallel. There is thus a problem that when the number of bits m is large, the element area is large. It is thus necessary to use a different principle from the above technique in order to simplify the structure of the optical A-D converter.

The present invention has been accomplished to solve the above problems and an object of the present invention is thus to provide a light intensity subtractor with a simple structure using an electrical feedback circuit, an optical A-D converter using the same, and a simple method for subtracting light intensity.

Solution to Problem

A light intensity subtractor according to one aspect of the present invention includes a light input port where input light is input; a first light output port where first output light is output; a second light output port where second output light is output; a light subtracting unit that receives the input light through the light input port, outputs the first output light to the first light output port and outputs the second output light to the second light output port; and a feedback circuit connected to the light subtracting unit through the second light output port, for outputting a control voltage in accordance with light intensity of the received second output light, wherein the light subtracting unit generates the first output light by reducing light intensity of the second output light from light intensity of the input light in accordance with the control voltage.

A method for subtracting light intensity according to one aspect of the present invention generates first output light by performing subtracting operation that reduces light intensity of second output light from light intensity of input light in accordance with a control voltage; outputs the first output light and the second output light; receives the second output light and generates the control voltage in accordance with light intensity of the received second output light; and makes feedback control of the subtracting operation based on the control voltage.

Advantageous Effects of Invention

According to the present invention, it is possible to provide a light intensity subtractor with a simple structure using an electrical feedback circuit, an optical A-D converter using the same, and a simple method for subtracting light intensity.

BRIEF DESCRIPTION OF DRAWINGS

FIG. 4 is an operation table showing an example of operation of the light intensity subtractor according to the second embodiment;

DESCRIPTION OF EMBODIMENTS

Embodiments of the present invention will be described hereinbelow with reference to the drawings. Note that, in the figures, the identical reference symbols denote identical structural elements and the redundant explanation thereof is omitted.

First Embodiment

Figure 1:
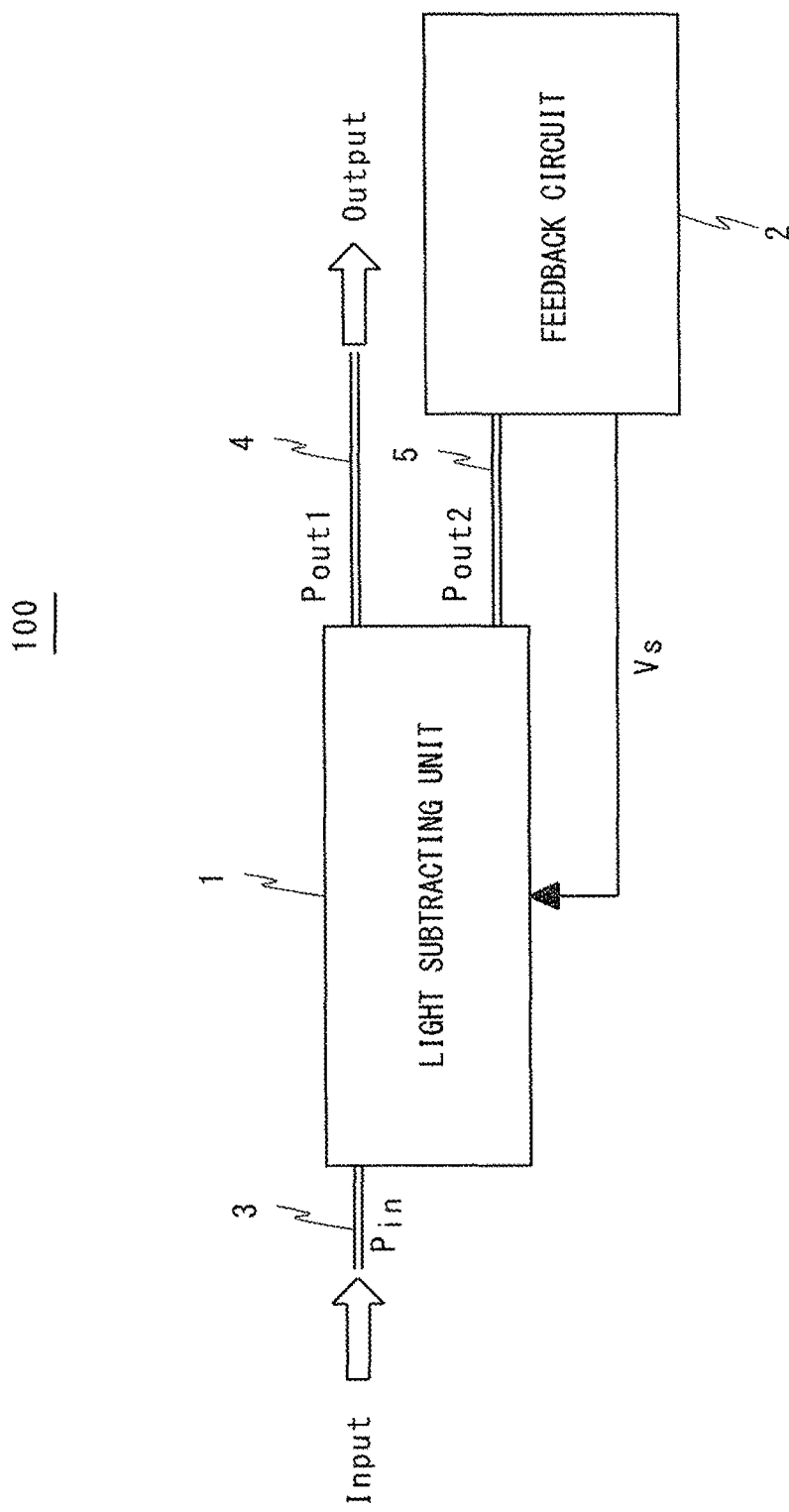
FIG. 1 is a block diagram showing a structure of a light intensity subtractor according to a first embodiment.

A light intensity subtractor 100 according to a first embodiment is described first. The light intensity subtractor 100 reduces a certain amount of light intensity from the light intensity of an input optical signal using an electrical feedback circuit. FIG. 1 is a block diagram showing a structure of a light intensity subtractor 100 according to the first embodiment. The structure and the principle of operation of the light intensity subtractor 100 are described hereinafter with reference to FIG. 1. The light intensity subtractor 100 includes a light subtraction unit 1, a feedback circuit 2, a light input port 3, a first light output port 4, and a second light output port 5.

Input light (light intensity $P_{in}$) from a light input Input is input to the light subtraction unit 1 through the light input port 3. The light subtraction unit 1 then outputs first output light (light intensity $P_{out1}$) to a light output Output through the first light output port 4. Further, the light subtraction unit 1 outputs second output light (light intensity $P_{out2}$) to the feedback circuit 2 through the second light output port 5.

The feedback circuit 2 converts the light intensity $P_{out2}$ of the second output light to be input into a control voltage V. The feedback circuit 2 outputs the control voltage $v_s$ to the light subtraction unit 1.

The operation of the light intensity subtractor 100 is described next. First, input light is input from the light input port 3 to the light subtraction unit 1. The input light is split into the first output light and the second output light by the light subtraction unit 1. In this case, the light intensity $P_{out1}$ of the first output light that is output to the light output Output is represented by the following expression (1):

$$P_{out1} = P_{in} - P_{out2} \quad (1)$$

Specifically, the light subtraction unit 1 reduces the second output light from the input light and thereby generates the first output light.

The feedback circuit 2 monitors the light intensity $P_{out2}$ of the second output light and compares whether the light intensity $P_{out2}$ of the second output light is equal to desirable light intensity (reference light intensity $P_{ref2}$). Then, the feedback circuit 2 generates the control voltage $V_s$ based on a result of the comparison. The control voltage $V_s$ is fed back to the light subtraction unit 1. The light subtraction unit 1 adjusts the light intensity $P_{out1}$ of the first output light and the light intensity $P_{out2}$ of the second output light based on the control voltage $V_s$.

Hereinafter, several cases are described with respect to a difference between the light intensity $P_{out2}$ of the second output light and the reference light intensity $P_{ref2}$. First, the case where the light intensity $P_{out2}$ of the second output light is equal to the reference light intensity $P_{ref2}$ is described. In this case, the light intensity $P_{out2}$ of the second output light is the same as the reference light intensity $P_{ref2}$. This means that the light intensity $P_{out1}$ of the first output light is also the same as desirable light intensity (desirable output light intensity $P_{ref1}$) from the expression (1). Thus, in this case, desired subtracting operation is achieved in the light intensity subtractor 100.

Next, the case where the light intensity $P_{out2}$ of the second output light is higher than the reference light intensity $P_{ref2}$ is described. In this case, the light intensity $P_{out1}$ of the first output light is lower than the desirable output light intensity $P_{ref1}$ from the expression (1). Then, the feedback circuit 2 controls the light subtraction unit 1 so as to increase the light intensity $P_{out1}$ of the first output light and decrease the light intensity $P_{out2}$ of the second output light using the control voltage $V_s$. The light intensity $P_{out1}$ of the first output light thereby becomes closer to the desirable output light intensity $P_{ref1}$. As a result, the light intensity subtractor 100 reaches its desired subtracting operation.

On the other hand, the case where the light intensity $P_{out2}$ of the second output light is lower than the reference light intensity $P_{ref2}$ is described. In this case, the light intensity $P_{out1}$ of the first output light is higher than the desirable output light intensity $P_{ref1}$ from the expression (1). Then, the feedback circuit 2 controls the light subtraction unit 1 so as to decrease the light intensity $P_{out1}$ of the first output light and increase the light intensity $P_{out2}$ of the second output light using the control voltage $V_s$. The light intensity $P_{out1}$ of the first output light thereby becomes closer to the desirable output light intensity $P_{ref1}$. As a result, the light intensity subtractor 100 reaches its desired subtracting operation.

By repeating the above feedback operation, the light intensity subtractor 100 converges on the desired state of subtracting operation. Consequently, the light intensity subtractor 100 can output the first output light having the desirable output light intensity $P_{ref1}$.

Thus, according to this structure, the light intensity subtractor can be constructed simply by placing a general feedback circuit. It is thereby possible to provide a light intensity subtractor with a simple structure without significant increase in element area.

Second Embodiment

Figure 2:
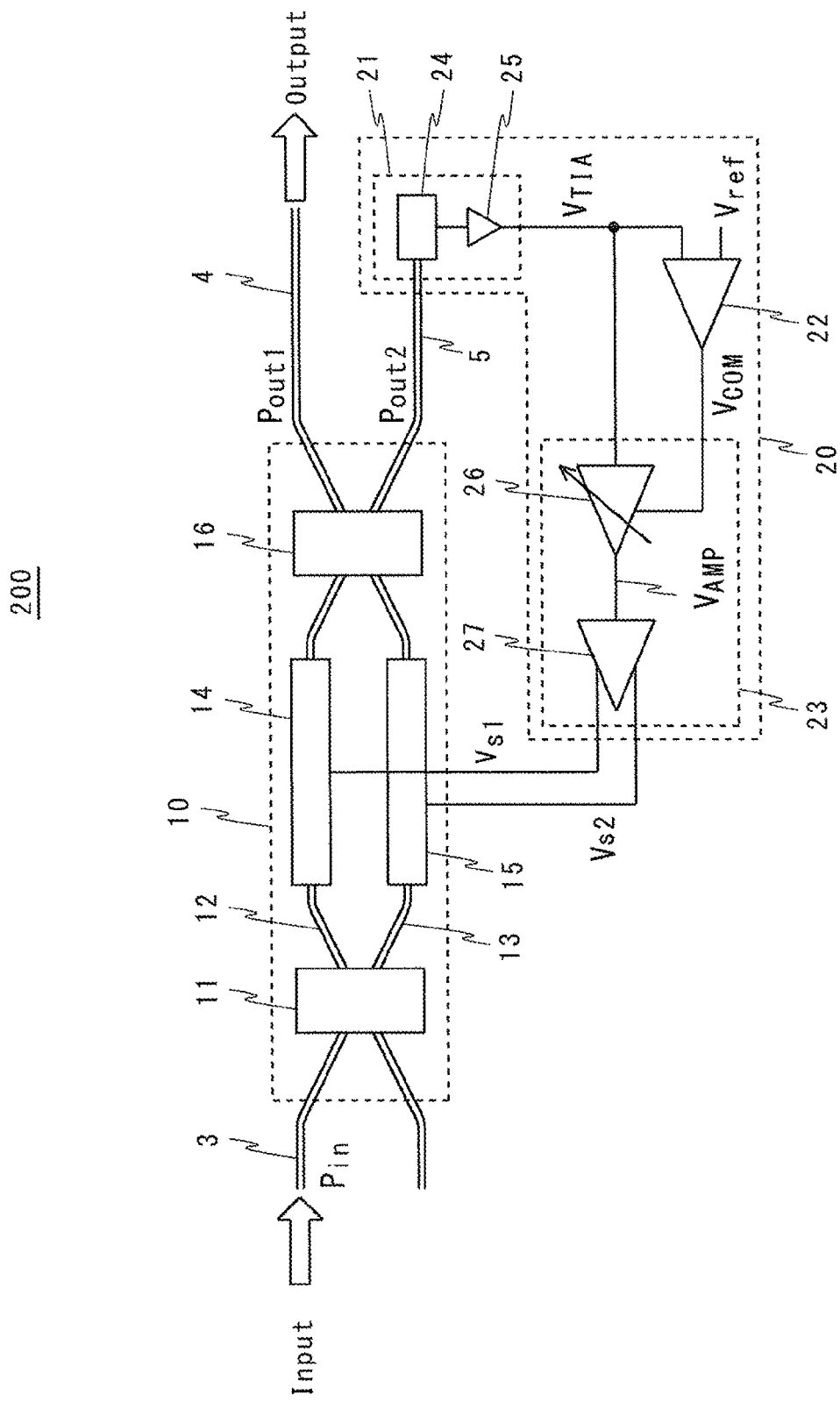
FIG. 2 is a block diagram showing a structure of a light intensity subtractor according to a second embodiment.

A light intensity subtractor 200 according to a second embodiment is described hereinafter. The light intensity subtractor 200 is a specific example of the light intensity subtractor 100 according to the first embodiment. FIG. 2 is a block diagram showing a structure of the light intensity subtractor 200 according to the second embodiment. The structure and the principle of operation of the light intensity subtractor 200 are described hereinafter with reference to FIG. 2.

The light intensity subtractor 200 includes a light subtraction unit 10 and a feedback circuit 20. The light subtraction unit 10 corresponds to the light subtraction unit 1 of the light intensity subtractor 100. The feedback circuit 20 corresponds to the feedback circuit 2 of the light intensity subtractor 100. Further, a first control voltage $V_{s1}$ and a second control voltage $V_{s2}$ correspond to the control voltage $V_s$ of the light intensity subtractor 100. The other structure of the light intensity subtractor 200 is the same as that of the light intensity subtractor 100 and not redundantly described.

The light subtraction unit 10 includes an optical demultiplexer 11, a first optical waveguide 12, a second optical waveguide 13, a first electrode 14, a second electrode 15, and an optical multiplexer 16. The light input end of the optical demultiplexer 11 is optically connected to the light input Input through the light input port 3. The first optical waveguide 12 and the second optical waveguide 13 are placed in parallel between the light output end of the optical demultiplexer 11 and the light input end of the optical multiplexer 16. The first electrode 14 is formed on the first optical waveguide 12. The second electrode 15 is formed on the second optical waveguide 13. The light output end of the optical multiplexer 16 is optically connected to the light output port 4. Further, the light output end of the optical multiplexer 16 is connected to the feedback circuit 20 through the second light output port 5.

The light subtraction unit 10, the light input port 3, the first light output port 4 and the second light output port 5 form one Mach-Zehnder interferometer (MZI).

The feedback circuit 20 includes a light receiving unit 21, a comparator 22, and a control unit 23. The light receiving unit 21 includes a photodetector 24 and a transimpedance amplifier (TIA) 25. The control unit 23 includes a variable gain amplifier 26 and a differential amplifier 27.

The output terminal of the photodetector 24 is connected to one input terminal of the comparator 22 and the input terminal of the variable gain amplifier 26 through the TIA 25. The reference voltage $V_{ref}$ is supplied to the other input terminal of the comparator 22. The output terminal of the comparator 22 is connected to the control terminal of the variable gain amplifier 26. The output terminal of the variable gain amplifier 26 is connected to the input terminal of the differential amplifier 27. The first control voltage $V_{s1}$ is output from one output terminal of the differential amplifier 27 to the first electrode

14. The second control voltage $V_{s2}$ is output from the other output terminal of the differential amplifier 27 to the second electrode 15.

The operation of the light intensity subtractor 200 is described next. First, input light (light intensity $P_{in}$) is input from the light input port 3 to the optical demultiplexer 11. Note that it is assumed in the following description that the level of the light intensity $P_{in}$ is 100. The input light is split into first split light and second split light by the optical demultiplexer 11. The first split light and the second split light have the light intensity of 50:50 in ratio. The optical demultiplexer 11 outputs the first split light to the first optical waveguide 12. Further, the optical demultiplexer 11 outputs the second split light to the second optical waveguide 13.

For example, in the case where the optical demultiplexer 11 is a 2×2 multi-mode interference (MMI) demultiplexer, a phase difference of 90° occurs between the first split light and the second split light. Further, for example, in the case where the optical demultiplexer 11 is a Y branch circuit, no phase difference occurs between the first split light and the second split light.

In the light intensity subtractor 200, the refractive index of the first optical waveguide 12 can be changed by applying a voltage to the first electrode 14. The phase of the first split light passing through the first optical waveguide 12 can be thereby changed. Further, the refractive index of the second optical waveguide 13 can be changed by applying a voltage to the second electrode 15. The phase of the second split light passing through the second optical waveguide 13 can be thereby changed.

The first split light that has passed through the first optical waveguide 12 and the second split light that has passed through the second optical waveguide 13 are input to the optical multiplexer 16. The optical multiplexer 16 outputs first output light and second output light to the first light output port 4 and the second light output port 5, respectively. Because the light intensity subtractor 200 includes the MZI, the light intensity $P_{out1}$ of the first output light and the light intensity $P_{out2}$ of the second output light are determined by a phase difference between the first split light having passed through the first optical waveguide 12 and the second split light having passed through the second optical waveguide 13.

For example, when a phase difference between the first split light having passed through the first optical waveguide 12 and the second split light having passed through the second optical waveguide 13 is 0°, the ratio of light intensity $P_{out1}$ of the first output light and the light intensity $P_{out2}$ of the second output light is 50:50. Further, for example, when a phase difference between the first split light having passed through the first optical waveguide 12 and the second split light having passed through the second optical waveguide 13 is 90°, the light is not split and only the second output light ($P_{out2}=100$) is output to the second light output port 5. Further, for example, when a phase difference between the first split light having passed through the first optical waveguide 12 and the second split light having passed through the second optical waveguide 13 is 270° (−90°), the light is not split and only the first output light ($P_{out1}=100$) is output to the first light output port 4.

Specifically, as a phase difference between the first split light having passed through the first optical waveguide 12 and the second split light having passed through the second optical waveguide 13 changes from 0° to 90°, the light intensity $P_{out1}$ of the first output light decreases from 50 to 0. After that, as a phase difference between the first split light having passed through the first optical waveguide 12 and the second split light having passed through the second optical waveguide 13 changes from 90° to 180°, the light intensity $P_{out1}$ of the first output light increases from 0 to 50. Further, as a phase difference changes from 180° to 270°, the light intensity $P_{out1}$ of the first output light increases from 50 to 100.

On the other hand, as a phase difference between the first split light having passed through the first optical waveguide 12 and the second split light having passed through the second optical waveguide 13 changes from 0° to 90°, the light intensity $P_{out2}$ of the second output light increases from 50 to 100. After that, as a phase difference between the first split light having passed through the first optical waveguide 12 and the second split light having passed through the second optical waveguide 13 changes from 90° to 180°, the light intensity $P_{out2}$ of the second output light decreases from 100 to 50. Further, as a phase difference changes from 180° to 270°, the light intensity $P_{out2}$ of the second output light decreases from 50 to 0.

Specifically, by adjusting a phase difference of light input to the optical multiplexer 16, the ratio of the light intensity $P_{out1}$ of the first output light and the light intensity $P_{out2}$ of the second output light can be changed. With use of such characteristics, the light intensity subtractor 200 according to this embodiment reduces a certain amount of light intensity from the input light to the light intensity subtractor 200, that is, performs the subtracting operation shown in the expression (1).

The light receiving unit 21 of the feedback circuit 2 receives the second output light (light intensity $P_{out2}$). The light receiving unit 21 converts the light intensity $P_{out2}$ of the second output light from optical to electrical and generates an output voltage. Specifically, the photodetector 24 (PD) monitors the light intensity $P_{out2}$ of the second output light. The photodetector 24 absorbs the received second output light and generates a photoelectric current corresponding to the light intensity $P_{out2}$ of the second output light. The photoelectric current is generally weak and therefore amplified by the TIA 25. The TIA 25 converts the photoelectric current into a voltage, amplifies the signal and then output the converted voltage. Thus, an output voltage $V_{TIA}$ represents the light intensity $P_{out2}$ of the second output light.

The comparator 22 compares the output voltage $V_{TIA}$ with reference voltage $V_{ref}$. The reference voltage $V_{ref}$ corresponds to the reference light intensity $P_{ref2}$ according to the first embodiment. Thus, comparing the output voltage $V_{TIA}$ with the reference voltage $V_{ref}$ means comparing the light intensity $P_{out2}$ of the second output light with the reference light intensity $P_{ref2}$. The comparator 22 outputs a comparison result voltage $V_{com}$ corresponding to a difference between the output voltage $V_{TIA}$ and the reference voltage $V_{ref}$ to the variable gain amplifier 26.

The variable gain amplifier 26 amplifies the output voltage $V_{TIA}$ of the TIA 25 according to the comparison result voltage $V_{com}$. The variable gain amplifier 26 outputs the amplified voltage as an output voltage $V_{AMP}$. The differential amplifier 27 generates differential signals according to the output voltage $V_{AMP}$. One of the generated differential signals is output to the first electrode 14 as a first control voltage $V_{s1}$. The other one of the generated differential signals is output to the second electrode 15 as a second control voltage $V_{s2}$.

Hereinafter, several cases are described with respect to a difference between the output voltage $V_{TIA}$ and the reference voltage $V_{ref}$. First, the case where the output voltage $V_{TIA}$ is equal to the reference voltage $V_{ref}$ is described. In this case, the light intensity $P_{out2}$ of the second output light is desirable light intensity. This means that the light intensity $P_{out1}$ of the first output light is also the same as desirable light intensity (desirable output light intensity $P_{ref1}$) from the expression (1).

Thus, in this case, desired subtracting operation is achieved in the light intensity subtractor 200.

Next, the case where the output voltage $V_{TIA}$ is higher than the reference voltage $V_{ref}$ is described. In this case, the light intensity $P_{out1}$ of the first output light is lower than the desirable output light intensity $P_{ref1}$ from the expression (1). In this case, the comparator 22 outputs the comparison result voltage $V_{com}=V_{TIA}-V_{ref}$. The variable gain amplifier 26 outputs the output voltage $V_{AMP}$ generated by amplifying the output voltage $V_{TIA}$ according to the comparison result voltage $V_{com}$ to the differential amplifier 27. The differential amplifier 27 applies the first control voltage $V_{s1}$ and the second control voltage $V_{s2}$ to the first electrode 14 and the second electrode 15, respectively, according to the output voltage $V_{AMP}$. A phase difference between the first split light having passed through the first optical waveguide 12 and the second split light having passed through the second optical waveguide 13 is thereby adjusted, and the light intensity $P_{out2}$ of the second output light decreases. As a result, the light intensity $P_{out1}$ of the first output light increases and becomes closer to the desirable output light intensity $P_{ref1}$.

Next, the case where the output voltage $V_{TIA}$ is lower than the reference voltage $V_{ref}$ is described. In this case, the light intensity $P_{out1}$ of the first output light is higher than the desirable output light intensity $P_{ref1}$ from the expression (1). In this case, the comparator 22 outputs the comparison result voltage $V_{com}=V_{TIA}-V_{ref}$. The variable gain amplifier 26 outputs the output voltage $V_{AMP}$ generated by amplifying the output voltage $V_{TIA}$ according to the comparison result voltage $V_{com}$ to the differential amplifier 27. The differential amplifier 27 applies the first control voltage $V_{s1}$ and the second control voltage $V_{s2}$ to the first electrode 14 and the second electrode 15, respectively, according to the output voltage $V_{AMP}$. A phase difference between the first split light having passed through the first optical waveguide 12 and the second split light having passed through the second optical waveguide 13 is thereby adjusted, and the light intensity $P_{out2}$ of the second output light increases. As a result, the light intensity $P_{out1}$ of the first output light decreases and becomes closer to the desirable output light intensity $P_{ref1}$.

By repeating the above feedback operation, the light intensity subtractor 200 converges on the desired state of subtracting operation, just like the light intensity subtractor 100 according to the first embodiment. Consequently, the light intensity subtractor 200 can output the first output light having the desirable output light intensity $P_{ref1}$.

Thus, according to this structure, the light intensity subtractor can be constructed simply by placing a general feedback circuit, just like the light intensity subtractor 100 according to the first embodiment. It is thereby possible to provide a light intensity subtractor with a simple structure without significant increase in element area.

Further, because the feedback circuit 20 can be constructed with a general comparator and amplifier, the light intensity subtractor 200 is advantageous over a general light intensity subtractor in the reduction of circuit area.

Next, the case where the light intensity $P_{in}$ of input light is less than the reference light intensity $P_{ref2}$ is described. In this case, even if the above feedback control is carried out, the light intensity $P_{out2}$ of the second output light cannot converge on the reference light intensity $P_{ref2}$. As a result, the light intensity $P_{out1}$ of the first output light also does not converge on the desirable output light intensity $P_{ref1}$. Thus, in this case, it is necessary to take measures to stop the feedback control.

Figure 3:
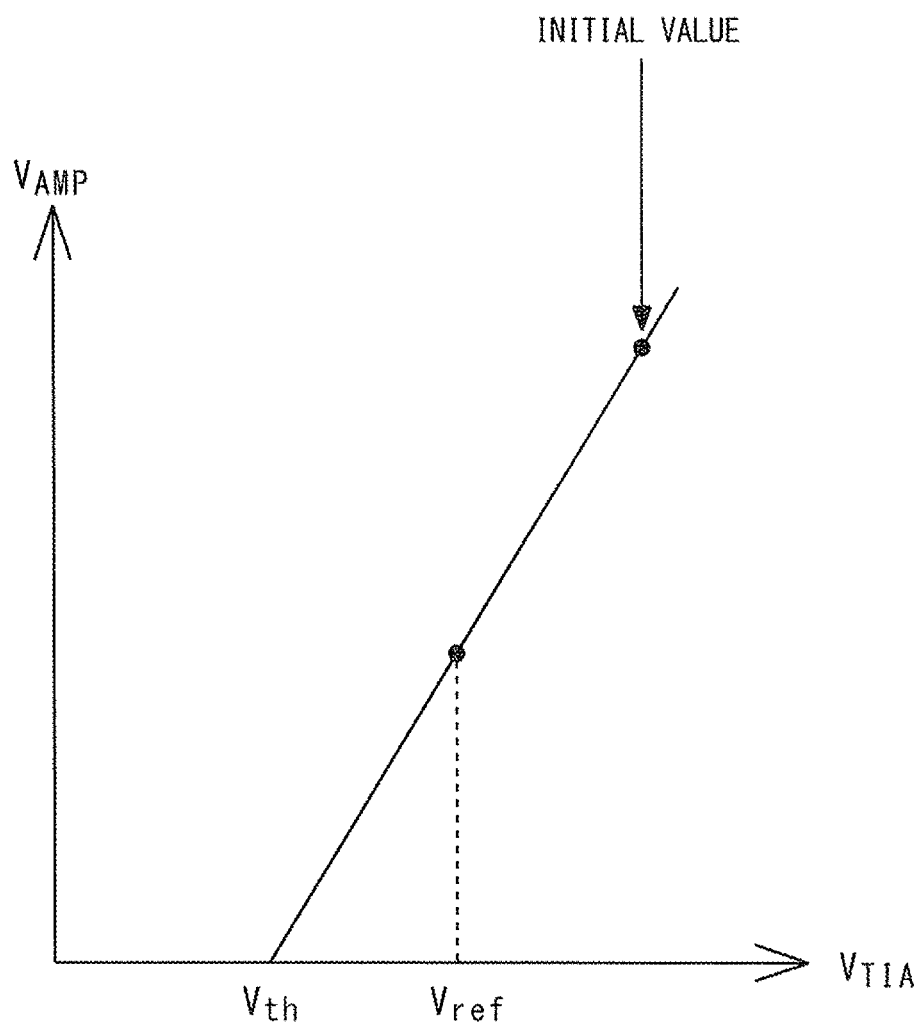
FIG. 3 is a graph showing an output voltage of a variable gain amplifier according to the second embodiment.

The feedback control can be stopped by the variable gain amplifier 26. In this case, the variable gain amplifier 26 performs the amplifying operation only when the comparison result voltage $V_{com}$ of the comparator 22 is higher than a threshold voltage $V_{th}$. FIG. 3 is a graph showing the output voltage $V_{AMP}$ of the variable gain amplifier 26. As shown in FIG. 3, the variable gain amplifier 26 outputs the output voltage $V_{AMP}$ when the comparison result voltage $V_{com}$ is higher than the threshold voltage $V_{th}$.

The value of the threshold voltage $V_{th}$ is as follows. In the above-described feedback control, the output voltage $V_{TIA}$ converges on the reference voltage $V_{ref}$ through oscillation around the reference voltage $V_{ref}$. It is thus necessary to save a certain range centering on the reference voltage $V_{ref}$ as an oscillation range. Thus, if the threshold voltage $V_{th}$ is set within the oscillation range, the feedback control stops midway through. It is thus desired to set a lower voltage than the reference voltage $V_{ref}$ to the threshold voltage $V_{th}$. Specifically, it is desired to set a voltage slightly lower than the lower limit of the above oscillation range to the threshold voltage $V_{th}$.

Further, in order to avoid malfunctions of the light intensity subtractor 200, the output voltage $V_{TIA}$ in the initial state before start of the feedback control is preferably higher than the reference voltage $V_{ref}$. The output voltage $V_{TIA}$ thereby starts dropping from the start of the feedback control and then converges on the reference voltage $V_{ref}$. By setting the output voltage $V_{TIA}$ in the initial state so as not to fall below the threshold voltage $V_{th}$, the feedback control can be started without fail. This can be made by setting the photodetector 24 to normally on.

A method of setting the photodetector 24 to normally on is described hereinbelow. To set the photodetector 24 to normally on, the optical demultiplexer 11 and the optical multiplexer 16 composed of 2×2 MMI are used, and the photodetector 24 is placed at the cross position with respect to the light input Input (FIG. 2). Then, a phase difference between the first split light having passed through the first optical waveguide 12 and the second split light having passed through the second optical waveguide 13 in the initial state is set to 90°. Only the second output light ($P_{out2}=100$) is thereby output, and the photodetector 24 can be in the normally on state. Note that a phase difference between the first split light having passed through the first optical waveguide 12 and the second split light having passed through the second optical waveguide 13 in the initial state can be set to 90° by appropriately setting the output voltage $V_{AMP}$ in the initial state of the variable gain amplifier 26 as a matter of course.

As described above, when the photodetector 24 is normally on, the light intensity $P_{out2}$ of the second output light is 100 ($P_{out2}=P_{in}$). Therefore, if the light intensity $P_{out2}$ of the second output light is higher than the reference light intensity $P_{ref2}$, the output voltage $V_{TIA}$ in the initial state is higher than the reference voltage $V_{ref}$.

On the other hand, if the light intensity $P_{out2}$ is lower than the reference light intensity $P_{ref2}$, the output voltage $V_{TIA}$ in the initial state is lower than the reference voltage $V_{ref}$. The feedback controls is thus not made. In this case, the light intensity subtractor 200 outputs only the first output light ($P_{out1}=100$). In other words, the output voltage $V_{AMP}$ by which a phase difference between the first split light having passed through the first optical waveguide 12 and the second split light having passed through the second optical waveguide 13 becomes 180° is output by the variable gain amplifier 26. The light intensity $P_{out1}$ of the first output light thereby becomes 100 ($P_{out1}=P_{in}$). Thus, the light intensity subtractor 200 outputs the input light that is input from the light input Input as it is to the light output Output.

FIG. 4 is an operation table showing an example of operation of the light intensity subtractor 200. As shown in FIG. 4, when input voltage (the output voltage $V_{TIA}$ of the TIA 25) to the variable gain amplifier 26 is lower than the threshold voltage $V_{th}$, a phase shift amount by the first electrode 14 is 0, and a phase shift amount by the second electrode 15 is π(180°). In the initial state, which is the state where the photodetector 24 is normally on, the shift amount by the first electrode 14 and the shift amount by the second electrode 15 are equal, which are both π/2, for example. Further, when a phase shift amount corresponding to the reference voltage $V_{ref}$ is χ, a phase shift amount by the first electrode 14 is χ, and a phase shift amount by the second electrode 15 is π–χ when converged.

In the light intensity subtractor 200, the operation shown in the operation table of FIG. 4 is implemented by using the suitable comparator 22 and the variable gain amplifier 26 having the suitable threshold voltage $V_{th}$.

Thus, according to this structure, the light intensity subtractor can be implemented by placing a feedback circuit using a general amplifier. It is thereby possible to provide a light intensity subtractor with a simple structure without significant increase in element area.

Third Embodiment

Figure 5:
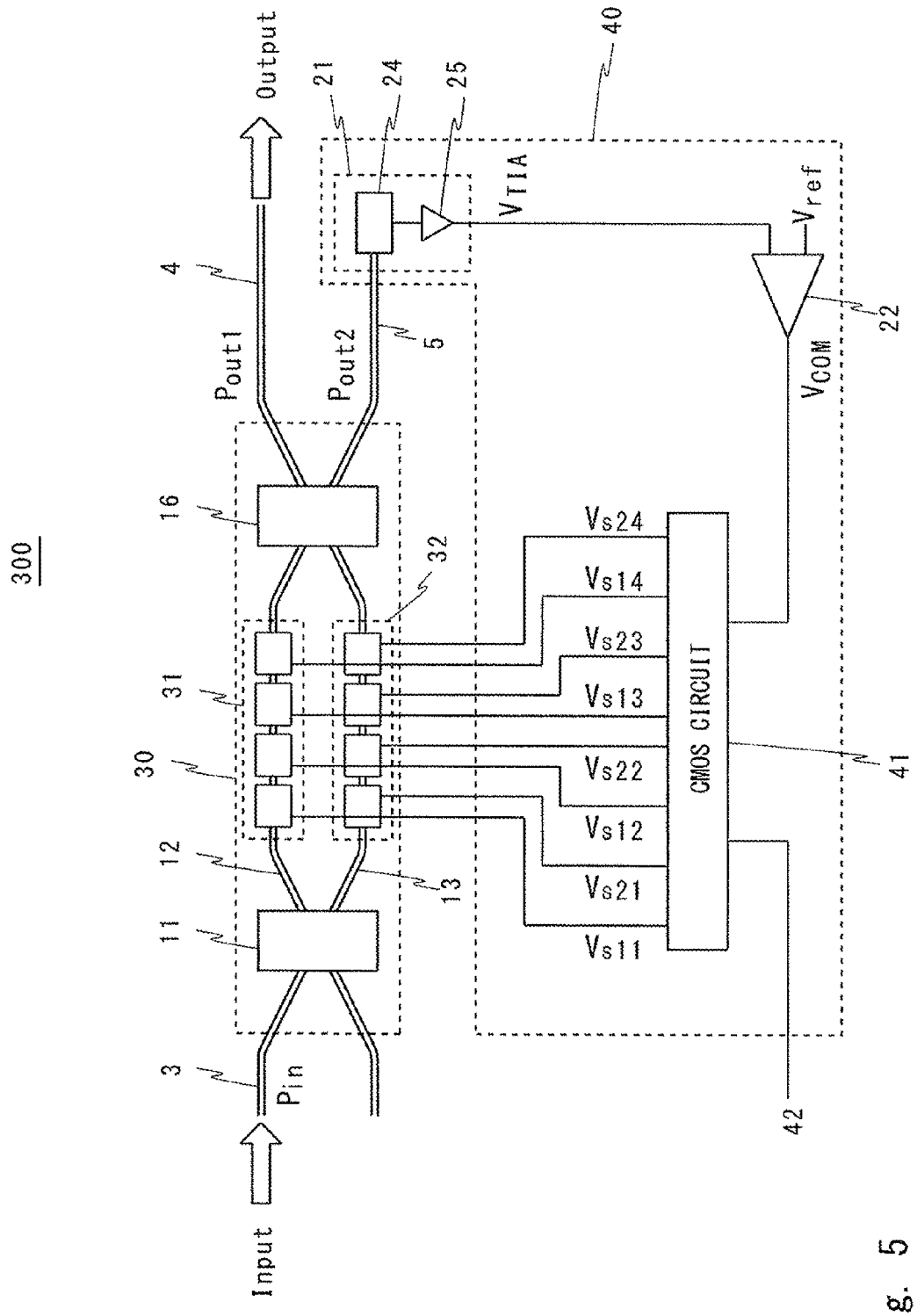
FIG. 5 is a block diagram showing a structure of a light intensity subtractor according to a third embodiment.

A light intensity subtractor 300 according to a third embodiment is described hereinbelow. The light intensity subtractor 300 is an example of alternative structure of the light intensity subtractor 200 according to the second embodiment. FIG. 5 is a block diagram showing a structure of the light intensity subtractor 300 according to the third embodiment. As shown in FIG. 5, the light intensity subtractor 300 includes a light subtraction unit 30 and a feedback circuit 40. The light subtraction unit 30 corresponds to the light subtraction unit 10 of the light intensity subtractor 200. The feedback circuit 40 corresponds to the feedback circuit 20 of the light intensity subtractor 200.

In the light subtraction unit 30, the first electrode 14 and the second electrode 15 of the light subtraction unit 10 are replaced with a first split electrode unit 31 and a second split electrode unit 32, respectively. In the feedback circuit 40, the control unit 23 of the feedback circuit 20 is replaced with a control circuit 41. The other structure of the light intensity subtractor 300 is the same as that of the light intensity subtractor 200 and not redundantly described.

The first split electrode unit 31 and the second split electrode unit 32 are made up of a plurality of split electrodes. For example, when the first optical waveguide 12 and the second optical waveguide 13 are formed using compound semiconductors, the electrode length of one split electrode of the first split electrode unit 31 and the second split electrode unit 32 is 1000 μm. Accordingly, when the number of splits is 4, the total length of split electrodes is 4000 μm. With the split electrode with the length of 1000 μm, in order to apply the maximum phase difference π which is required in this embodiment to light, it is generally necessary to apply a voltage of about 2V to 3V in the case of compound semiconductors, through it differs depending on the material composition. Thus, when the number of splits is 4, a voltage of about 0.5V to 0.75V, which is ¼ of the required voltage, needs to be applied to each of the split electrodes.

If the voltage required for each split electrode is as low as 0.5V to 0.75V, a CMOS circuit can be used as a driver circuit for applying a voltage. This allows a combination with a logic circuit, and a feedback circuit capable of multifunctional processing can be constructed. As a result, as shown in FIG. 5, the control unit 23 of the light intensity subtractor 200 can be replaced with the control circuit 41, which is a CMOS circuit.

In this case, the control voltages $V_{s11}$ to $V_{s14}$ and $V_{s21}$ to $V_{s24}$ that are output from the control circuit 41 are the same. Therefore, the gain control of the light intensity subtractor 300 is made by adjusting the number of split electrodes to be driven rather than adjusting the output voltage. It is thereby possible to adjust the phase shift amount of light.

Note that an external clock 42 may be supplied to the control circuit 41. It is thereby possible to achieve synchronization even when the n (n is an integer of 2 or above) number of light intensity subtractors 300 are connected in series.

Fourth Embodiment

An optical A-D converter 400 according to a fourth embodiment is described hereinafter. In order to demodulate a multiplexed multi-valued optical signal, it is necessary to detect the phase and amplitude state of light. However, it is difficult to detect the state of light on the complex plane. Therefore, a technique that makes separation into the real part (I) and the imaginary part (Q) in the previous stage and detects information of I and Q respectively using two parallel receivers is commonly used. For example, in the technique called coherent light detection, each of the four local light having phases different by 90 degrees is made to interfere with signal light using a device called optical phase hybrid. Two systems of output light for I and two systems of output light for Q are thereby obtained, and the light of each system is received by the photodetector (PD). The optical A-D converter 400 according to the fourth embodiment decomposes the optical amplitude into multiple bits in the state of light as it is and acquires it as a digital value.

Figure 6:
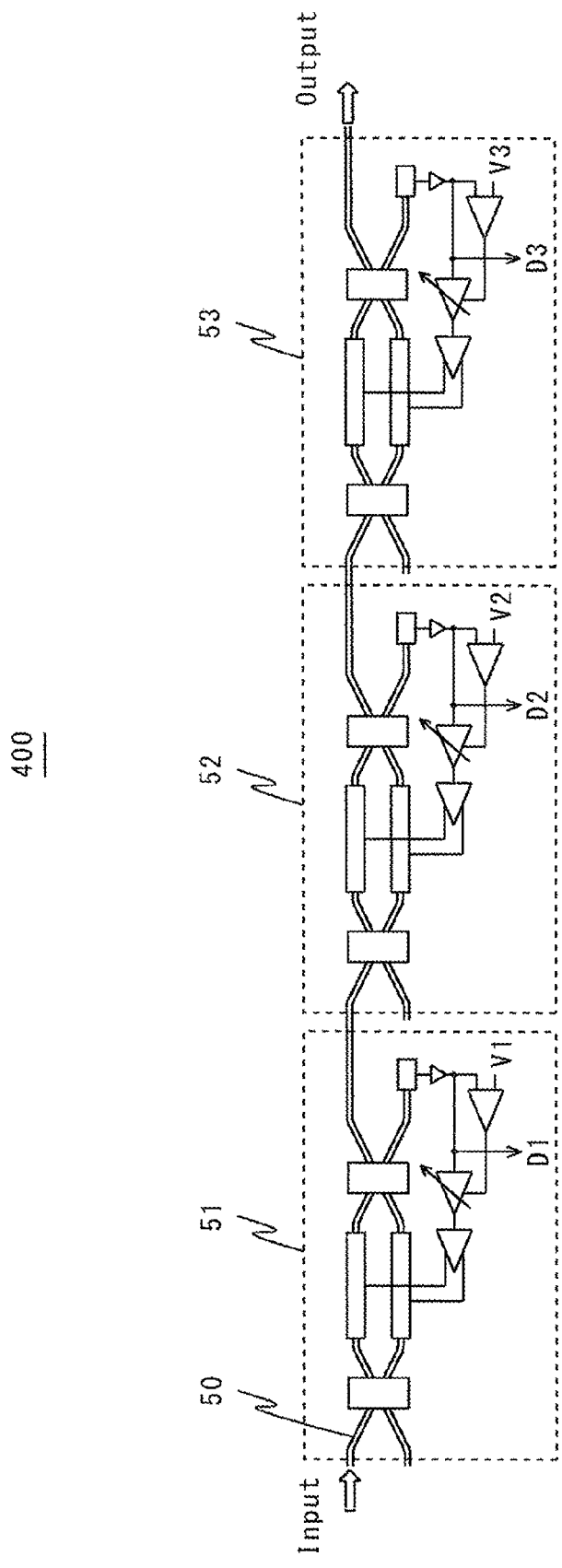
FIG. 6 is a block diagram showing a structure of an optical A-D converter according to a fourth embodiment.

FIG. 6 is a block diagram showing a structure of the optical A-D converter 400 according to the fourth embodiment. In FIG. 6, a structure example of a 3-bit A-D converter is shown. As shown in FIG. 6, the optical A-D converter 400 includes first to third light intensity subtractors 51 to 53 connected in series. As the light intensity subtractors 51 to 53, the light intensity subtractor 100, 200 or 300 according to the first to third embodiment is used. A light input port 50 of the first light intensity subtractor 51 is connected to a light input Input, and input light is input thereto. The input light is first introduced into the first light intensity subtractor 51 and then introduced into the second light intensity subtractor 52 and the third light intensity subtractor 53.

Reference voltages V1 to V3 are set to the first to third light intensity subtractors 51 to 53, respectively. The reference voltages V1 to V3 are different voltages from one another. Further, threshold voltages $V_{th1}$ to $V_{th3}$ are set to variable gain amplifiers of the first to third light intensity subtractors 51 to 53, respectively. The reference voltages V1 to V3 and the threshold voltages $V_{th1}$ to $V_{th3}$ are set to satisfy the following expression (2):

$$V1 > V_{th1} > V2 > V_{th2} > V3 > V_{th3} \qquad (2)$$

Further, digital output signals from the respective TIAs connected to photodetectors of the first to third light intensity subtractors 51 to 53 are D1 to D3. If the output of the photodetector is equal to a reference voltage in the first to third light intensity subtractors 51 to 53, the digital output signals D1 to D3 are "1". On the other hand, the output of the photodetector is 0, which is when the subtracting operation is not performed, the digital output signals D1 to D3 are "0". As described in the second embodiment, when the subtracting operation is not performed in the first to third light intensity subtractors 51 to 53, the light input to the first to third light intensity subtractors 51 to 53 are all output to the next stage.

By setting the reference voltages V1 to V3 appropriately, the digital output signals D1 to D3 are output as a bit string that is A-D converted from the input light. Therefore, according to this structure, the digital output signals D1 to D3 that are A-D converted from the input light from the light input Input can be obtained. The reference voltage V1 may be set to 4V, the reference voltage V2 may be set to 2V, the reference voltage V3 may be set to 1V, $V_{th1}$ may be set to 3V, $V_{th2}$ may be set to 1.5V and $V_{th3}$ may be set to 0.5V, for example.

In each of the first to third light intensity subtractors 51 to 53, differences between the reference voltages V1 to V3 and the threshold voltages $V_{th1}$ to $V_{th3}$ can be regarded as the margins of the light intensity subtractors. In general, it is preferably an intermediate value with respect to the reference voltage of the light intensity subtractor in the next stage so that it is lower than the level of the digital value as in the above example.

At the outputs of the digital output signals D1 to D3, a circuit to hold the value of a signal during a period corresponding to one bit of the signal can be added. It is thereby possible to obtain an accurate value by reading the held value even when the timing of each bit is slightly deviated. Further, the output timing of the digital output signals D1 to D3 can be adjusted by achieving synchronization using a clock. It is thereby possible to correct the time deviation of the subtracting operation of each bit.

Note that the first to third light intensity subtractors 51 to 53 can adjust the light intensity to be reduced using the reference voltages only. Therefore, the first to third light intensity subtractors 51 to 53 can have the same structure.

Note that, although the case of three bits is shown in FIG. 6, the n-bit optical A-D converter can be constructed by connecting the n (n is an integer of 2 or above) number of light intensity subtractors in series. Further, the element length is only n times with respect to the number of bits n as described above. Therefore, it is easy to increase the number of processing bits according to this structure.

The structure in the case where the n number of light intensity subtractors SUB1 to SUBn are connected in series is described hereinafter. The light input port 3 of the first light intensity subtractor SUB1 is connected to the light input Input. The first light output port 4 of the n-th light intensity subtractor SUBn is connected to the light output Output. The first light output port 4 of the k-th (k is an integer satisfying 1≤k≤(n−1)) light intensity subtractor SUBk is connected to the light input port 3 of the (k+1)th light intensity subtractor SUB(k+1). Input light can be thereby input from the outside to the optical A-D converter and then output light can be output to the outside through the n number of light intensity subtractors SUB 1 to SUBn.

According to this structure, a high speed and low power optical A-D converter can be implemented. By using the optical A-D converter for an optical demodulation circuit, it is possible to provide an optical demodulation circuit having advantages such as high speed and low power consumption. Specifically, the optical A-D converter according to this embodiment can be incorporated into a coherent detection circuit or an optical direct detection circuit.

Other Embodiments

The present invention is not restricted to the above-described embodiments, and various changes and modifications may be made without departing from the scope of the invention. For example, although an example of the optical A-D converter using the light intensity subtractors according to the first to third embodiments is described in the fourth embodiment, it is not limited thereto. In the case of subtracting the intensity of signal light by the light intensity subtractor, the level can be adjusted freely. Therefore, application to another optical component is possible, such as an optical attenuator, for example.

For the optical demultiplexer and the optical multiplexer according to the second and third embodiments described above, a generally used a 2×2 MMI, a Y branch circuit, a directional coupler or the like can be used, for example.

In the previous stage of the photodetector according to the second and third embodiments described above, an optical amplifier, an optical attenuator, an optical filter or the like may be placed to enhance the receiving sensitivity, as in the receiver used for general optical communications.

For the optical waveguides according to the second and third embodiments described above, a common material such as lithium niobate, compound semiconductor or silicon can be used, for example.

Further, although the structure in which components such as the optical waveguides and the photodetector are integrated is described as an example in the first to fourth embodiments described above, the structure is not limited thereto. For example, the structure in which those components are connected by an optical fiber may be employed.

Further, the length and the split number of split electrodes according to the third embodiment described above are not limited to the above examples. For example, the number of splits may be any integer of 2 or above.

The whole or part of the embodiments disclosed above can be described as, but not limited to, the following supplementary notes.

(Supplementary Note 1)

A light intensity subtractor comprising:

a light input port where input light is input;

a first light output port where first output light is output;

a second light output port where second output light is output;

a light subtraction unit that receives the input light through the light input port, outputs the first output light to the first light output port and outputs the second output light to the second light output port; and a feedback circuit that is connected to the light subtraction unit through the second light output port, and outputs a control voltage in accordance with light intensity of the received second output light, wherein the light subtraction unit generates the first output light by reducing light intensity of the second output light from light intensity of the input light in accordance with the control voltage.

(Supplementary Note 2)

The light intensity subtractor according to Supplementary note 1, wherein the feedback circuit compares the light intensity of the second output light with reference light intensity, and makes feedback control so that the light intensity of the second output light becomes equal to the reference light intensity.

(Supplementary Note 3)

The light intensity subtractor according to Supplementary note 1 or 2, wherein the light subtraction unit includes:

an optical demultiplexer that outputs first split light and second split light split from the input light input from the light input port;

a first optical waveguide that lets the first split light pass through, a second optical waveguide that lets the second split light pass through;

a first electrode that is placed on the first optical waveguide;

a second electrode that is placed on the second optical waveguide; and an optical multiplexer that multiplexes the first split light having passed through the first optical waveguide and the second split light having passed through the second optical waveguide, and outputs the first output light and the second output light to the first light output port and the second light output port, respectively, the light subtraction unit, the light input port, the first light output port and the second light output port form a Mach-Zehnder interferometer, and the feedback circuit adjusts intensity of the first output light and the second output light by applying the control voltage to each of the first electrode and the second electrode.

(Supplementary Note 4)

The light intensity subtractor according to Supplementary note 3, wherein the light input port and the second light output port are arranged at diagonal positions with the light attenuator placed therebetween.

(Supplementary Note 5)

The light intensity subtractor according to Supplementary note 4, wherein the feedback control circuit controls a phase difference between the first split light having passed through the first optical waveguide and the second split light having passed through the second optical waveguide before start of the feedback control to 90°.

(Supplementary Note 6)

The light intensity subtractor according to Supplementary note 5, wherein when light intensity of the second split light having passed through the second optical waveguide before start of the feedback control is less than the reference light intensity, the feedback control circuit controls a phase difference between the first split light having passed through the first optical waveguide and the second split light having passed through the second optical waveguide to 180° without starting the feedback control.

(Supplementary Note 7)

The light intensity subtractor according to Supplementary note 5 or 6, wherein the feedback circuit includes:

a light receiving unit that receives the second output light and outputting an output voltage generated by photoelectric conversion of the second output light;

a comparator that compares the output voltage with a reference voltage and outputting a result of the comparison as a comparison result signal; and a control unit that applies the control voltage to each of the first electrode and the second electrode in accordance with the comparison result signal.

(Supplementary Note 8)

The light intensity subtractor according to Supplementary note 7, wherein when the output voltage before start of the feedback control is less than a predetermined threshold voltage, the control unit controls a phase difference between the first split light having passed through the first optical waveguide and the second split light having passed through the second optical waveguide to 180°.

(Supplementary Note 9)

The light intensity subtractor according to Supplementary note 7 or 8, wherein the light receiving unit includes:

a photodetector that receives the second output light and outputs a photoelectric current in accordance with light intensity of the second output light; and a transimpedance amplifier that generates the output voltage by photoelectric conversion of the photoelectric current.

(Supplementary Note 10)

The light intensity subtractor according to any one of Supplementary notes 7 to 9, wherein the control unit includes:

a variable gain amplifier that amplifiers the output voltage in accordance with the comparison result signal; and an amplifier that generates the control voltage in accordance with the amplified output voltage.

(Supplementary Note 11)

The light intensity subtractor according to Supplementary note 10, wherein the amplifier is a differential amplifier, and the differential amplifier applies a first control voltage to the first electrode and applies a second control voltage different from the first control voltage to the second electrode.

(Supplementary Note 12)

The light intensity subtractor according to Supplementary note 7, wherein each of the first electrode and the second electrode is split into a plurality of split electrodes, and the control unit changes the number of split electrodes to which the control voltage is applied among the plurality of split electrodes in accordance with the comparison result signal.

(Supplementary Note 13)

An optical A-D converter comprising:

n (n is an integer of 2 or above) number of light intensity subtractors any one of Supplementary notes 7 to 12, wherein the n number of light intensity subtractors are connected in series, input light is input from outside to the light input port of the first light intensity subtractor, output light is output to outside from the first light output port of the n-th light intensity subtractor, the first light output port of the k-th (k is an integer satisfying 1≤k≤(n−1)) light intensity subtractor is connected to the (k+1)th light input port, and the output voltage from the light receiving unit of each of the n number of light intensity subtractors is output as a digital output signal.

(Supplementary Note 14)

The optical A-D converter according to Supplementary note 13, wherein the reference voltage different from one another is supplied to the comparator of each of the n number of light intensity subtractors.

(Supplementary Note 15)

The optical A-D converter according to Supplementary note 14, wherein the light receiving unit of each of the n number of light intensity subtractors outputs "1" as the output signal when the output voltage is equal to the reference voltage, and outputs "0" as the output signal when the output voltage is different from the reference voltage.

(Supplementary Note 16)

A method for subtracting light intensity comprising:

generating first output light by performing subtracting operation that reduces light intensity of second output light from light intensity of input light in accordance with a control voltage;

outputting the first output light and the second output light;

receiving the second output light and generating the control voltage in accordance with light intensity of the received second output light; and making feedback control of the subtracting operation based on the control voltage.

While the invention has been particularly shown and described with reference to embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2010-268146, filed on Dec. 1, 2010, the disclosure of which is incorporated herein in its entirety by reference.

INDUSTRIAL APPLICABILITY

The present invention may be used as an optical attenuator or an optical A-D converter, for example. Further, the present invention may be applied to a coherent detection circuit, an optical direct detection circuit or the like.

REFERENCE SIGNS LIST

D1 to D3 DIGITAL OUTPUT SIGNAL
Input LIGHT INPUT
Output LIGHT OUTPUT
$P_{in}$ LIGHT INTENSITY OF INPUT LIGHT
$P_{out1}$ LIGHT INTENSITY OF FIRST OUTPUT LIGHT
$P_{out2}$ LIGHT INTENSITY OF SECOND OUTPUT LIGHT
$P_{ref1}$ DESIRABLE OUTPUT LIGHT INTENSITY
$P_{ref2}$ REFERENCE LIGHT INTENSITY
$V_{Amp}$ OUTPUT VOLTAGE
$V_{TIA}$ OUTPUT VOLTAGE
$V_{com}$ COMPARISON RESULT VOLTAGE
V1 to V3, $V_{ref}$ REFERENCE VOLTAGE
$V_s$, $V_{s11}$ to $V_{s14}$, $V_{s21}$ to $V_{s24}$ CONTROL VOLTAGE
$V_{s1}$ FIRST CONTROL VOLTAGE
$V_{s2}$ SECOND CONTROL VOLTAGE
$V_{th}$, $V_{th1}$ to $V_{th3}$ THRESHOLD VOLTAGE
1, 10, 30 LIGHT SUBTRACTION UNIT
2, 20, 40 FEEDBACK CIRCUIT
3 LIGHT INPUT PORT
4 FIRST LIGHT OUTPUT PORT
5 SECOND LIGHT OUTPUT PORT
10 LIGHT SUBTRACTION UNIT
11 OPTICAL DEMULTIPLEXER
12 FIRST OPTICAL WAVEGUIDE
13 SECOND OPTICAL WAVEGUIDE
14 FIRST ELECTRODE
15 SECOND ELECTRODE
16 OPTICAL MULTIPLEXER
21 LIGHT RECEIVING UNIT
22 COMPARATOR
23 CONTROL UNIT
24 PHOTODETECTOR
25 TIA
26 VARIABLE GAIN AMPLIFIER
27 DIFFERENTIAL AMPLIFIER
31 FIRST SPLIT ELECTRODE UNIT
32 SECOND SPLIT ELECTRODE UNIT
41 CONTROL CIRCUIT
42 CLOCK
50 LIGHT INPUT PORT
51 to 53, 100, 200, 300 LIGHT INTENSITY SUBTRACTOR
400 A-D CONVERTER

The invention claimed is:

1. A light intensity subtractor comprising:
a light input port where input light is input;
a first light output port where first output light is output;
a second light output port where second output light is output;
a light subtracting unit that receives the input light through the light input port, outputs the first output light to the first light output port and outputs the second output light to the second light output port; and
a feedback circuit that is connected to the light subtracting unit through the second light output port, and outputs a control voltage in accordance with light intensity of the received second output light,
wherein the light subtracting unit generates the first output light by subtracting light intensity of the second output light from light intensity of the input light in accordance with the control voltage.

2. The light intensity subtractor according to claim 1, wherein
the feedback circuit compares the light intensity of the second output light with reference light intensity, and makes feedback so that the light intensity of the second output light becomes equal to the reference light intensity.

3. The light intensity subtractor according to claim 2, wherein
the light subtracting unit includes:
an optical demultiplexer that outputs first split light and second split light split from the input light input from the light input port;
a first optical waveguide that lets the first split light pass through,
a second optical waveguide that lets the second split light pass through;
a first electrode that is placed on the first optical waveguide;
a second electrode that is placed on the second optical waveguide; and
an optical multiplexer that multiplexes the first split light having passed through the first optical waveguide and the second split light having passed through the second optical waveguide, and outputs the first output light and the second output light to the first light output port and the second light output port, respectively,
the light subtracting unit, the light input port, the first light output port and the second light output port form a Mach-Zehnder interferometer, and
the feedback circuit adjusts intensity of the first output light and the second output light by applying the control voltage to each of the first electrode and the second electrode.

4. The light intensity subtractor according to claim 3, wherein
the light input port and the second light output port are arranged at diagonal positions with the light subtracting unit placed therebetween.

5. The light intensity subtractor according to claim 4, wherein
the feedback circuit controls a phase difference between the first split light having passed through the first optical waveguide and the second split light having passed through the second optical waveguide before start of the feedback control to 90°.

6. The light intensity subtractor according to claim 5, wherein
when light intensity of the second split light having passed through the second optical waveguide before start of the feedback control is less than the reference light intensity, the feedback circuit controls a phase difference between the first split light having passed through the first optical waveguide and the second split light having passed through the second optical waveguide to 180° without starting the feedback control.

7. The light intensity subtractor according to claim 5, wherein
the feedback circuit includes:
a light receiving unit that receives the second output light and outputs an output voltage generated by photoelectric conversion of the second output light;
a comparator that compares the output voltage with a reference voltage and outputs a result of the comparison as a comparison result signal; and
a control unit that applies the control voltage to each of the first electrode and the second electrode in accordance with the comparison result signal.

8. The light intensity subtractor according to claim 7, wherein
each of the first electrode and the second electrode is split into a plurality of split electrodes, and
the control unit changes the number of split electrodes to which the control voltage is applied among the plurality of split electrodes in accordance with the comparison result signal.

9. An optical A-D converter comprising:
n (n is an integer of 2 or above) number of light intensity subtractors according to claim 7, wherein
the n number of light intensity subtractors are connected in series,
input light is input from outside to the light input port of the first light intensity subtractor,
output light is output to outside from the first light output port of the n-th light intensity subtractor,
the first light output port of the k-th (k is an integer satisfying 1≤k≤(n−1)) light intensity subtractor is connected to the light input port of the (k+1)th light intensity subtractor, and
the output voltage from the light receiving unit of each of the n number of light intensity subtractors is output as a digital output signal.

10. A method for subtracting light intensity, the method comprising:
inputting input light to a light subtracting unit;
outputting first output light and second output light from the light subtracting unit; and
receiving the second output light output from the light subtracting unit and generating a control voltage in accordance with light intensity of the received second output light,
wherein the light subtracting unit generates the first output light by subtracting light intensity of the second output light from light intensity of the input light in accordance with the control voltage.

11. The light intensity subtractor according to claim 7, wherein
when the output voltage before start of the feedback control is less than a predetermined threshold voltage, the control unit controls a phase difference between the first split light having passed through the first optical waveguide and the second split light having passed through the second optical waveguide to 180°.

12. The light intensity subtractor according to claim 7, wherein
the light receiving unit includes:
a photodetector that receives the second output light and outputs a photoelectric current in accordance with light intensity of the second output light; and
a transimpedance amplifier that generates the output voltage by photoelectric conversion of the photoelectric current.

13. The light intensity subtractor according to claim 7, wherein
the control unit includes:
a variable gain amplifier that amplifiers the output voltage in accordance with the comparison result signal; and
an amplifier that generates the control voltage in accordance with the amplified output voltage.

14. The light intensity subtractor according to claim 13, wherein
the amplifier is a differential amplifier, and
the differential amplifier applies a first control voltage to the first electrode and applies a second control voltage different from the first control voltage to the second electrode.

15. The optical A-D converter according to claim 9, wherein
the reference voltage different from one another is supplied to the comparator of each of the n number of light intensity subtractors.

16. The optical A-D converter according to claim 15, wherein
the light receiving unit of each of the n number of light intensity subtractors outputs "1" as the output signal when the output voltage is equal to the reference voltage, and outputs "0" as the output signal when the output voltage is different from the reference voltage.

17. A light intensity subtractor comprising:
a light input port where input light is input;
a first light output port where first output light is output;
a second light output port where second output light is output;
a light subtracting means for receiving the input light through the light input port, outputting the first output light to the first light output port and outputting the second output light to the second light output port; and
a feedback circuit that is connected to the light subtracting means through the second light output port, and outputs a control voltage in accordance with light intensity of the received second output light,
wherein the light subtracting means generates the first output light by subtracting light intensity of the second output light from light intensity of the input light in accordance with the control voltage.

* * * * *

UNITED STATES PATENT AND TRADEMARK OFFICE
CERTIFICATE OF CORRECTION

PATENT NO. : 8,941,519 B2  Page 1 of 1
APPLICATION NO. : 13/990168
DATED : January 27, 2015
INVENTOR(S) : Kenji Sato It is certified that error appears in the above-identified patent and that said Letters Patent is hereby corrected as shown below:

In the specification

Column 5, Line 6: Delete "V." and insert -- $V_s$. --

Column 12, Line 29: Delete "1" and insert -- I --

Column 17, Line 36: Delete "$V_{Amp}$" and insert -- $V_{AMP}$ --

Signed and Sealed this
Twelfth Day of January, 2016

Michelle K. Lee
*Director of the United States Patent and Trademark Office*